(12) United States Patent
Chou et al.

(10) Patent No.: US 7,934,314 B2
(45) Date of Patent: May 3, 2011

(54) CONDUCTIVE FILM STRUCTURE, FABRICATION METHOD THEREOF, AND CONDUCTIVE FILM TYPE PROBE DEVICE FOR IC

(75) Inventors: Min-Chieh Chou, Taipei (TW); Tung-Chuan Wu, Hsinchu (TW); Jen-Hui Tsai, Hsinchu (TW); Hung-Yi Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 32 days.

(21) Appl. No.: 12/323,422

(22) Filed: Nov. 25, 2008

(65) Prior Publication Data
US 2009/0284275 A1 Nov. 19, 2009

(30) Foreign Application Priority Data

May 13, 2008 (TW) ................................ 97117542 A

(51) Int. Cl.
*H05K 3/02* (2006.01)
(52) U.S. Cl. ........ 29/846; 29/829; 324/754.03; 438/702
(58) Field of Classification Search .................. 324/754; 439/586; 174/254; 29/829, 846, 595, 848, 29/850; 438/702
See application file for complete search history.

(56) References Cited

U.S. PATENT DOCUMENTS

| 4,027,935 A | 6/1977 | Byrnes et al. |
| 4,778,950 A * | 10/1988 | Lee et al. ....................... 174/260 |
| 5,476,211 A | 12/1995 | Khandros |
| 6,268,015 B1 | 7/2001 | Mathieu et al. |
| 6,779,257 B2 * | 8/2004 | Kiepen et al. ................... 29/825 |
| 2005/0067293 A1 * | 3/2005 | Naito et al. ..................... 205/125 |

FOREIGN PATENT DOCUMENTS

| TW | 517320 | 1/2003 |
| TW | I280371 | 5/2007 |

* cited by examiner

*Primary Examiner* — David Vu
*Assistant Examiner* — Shaun Campbell

(57) ABSTRACT

A method for forming a conductive film structure is provided, which includes providing a flexible insulating substrate, forming a conductive film overlying the flexible insulating substrate, patterning the conductive film to form a plurality of micro-wires overlying the flexible insulating substrate, wherein the micro-wires are extended substantially parallel to each other, forming an insulating layer overlying the flexible insulating substrate and the micro-wires, and winding or folding the flexible insulating substrate along an axis substantially parallel to an extending direction of the micro-wires to form a conducting lump.

19 Claims, 6 Drawing Sheets

CONDUCTIVE FILM STRUCTURE, FABRICATION METHOD THEREOF, AND CONDUCTIVE FILM TYPE PROBE DEVICE FOR IC

CROSS REFERENCE TO RELATED APPLICATIONS

This Application claims priority of Taiwan Patent Application No. 097117542, filed on May 13, 2008, the entirety of which is incorporated by reference herein.

BACKGROUND OF THE INVENTION

1. Field of the Invention

The present invention relates to a conductive film structure and a fabrication method thereof, and in particular relates to a conductive film structure suitable for fabricating a probe card.

2. Description of the Related Art

Probe cards are used to perform electrical testing of integrated circuits (ICs) on a wafer before they are cut and packaged. Thus, allowing for determination of faulty ICs before further processing. With the development of nanoelectronic technologies, line widths of ICs have been shrunk to nano scale and the spacing between pads have also shrunk. Thus, probe cards with small probe pin pitches are required to accommodate the ICs with decreased spacing between pads.

According to the International Technology Roadmap for Semiconductor (ITRS), the smallest line width of an IC is currently 68 nanometers and the spacing between pads for testing is 30 µm. The ITRS expects the line width of an IC to further shrink to 36 nanometers and the spacing between pads for testing to be further shrink to 20 µm. However, currently, a serious technical bottleneck has been reached, for conventional probe cards to perform electrical testing of ICs on a wafer with pad spacing smaller than 30 µm.

Conventional probe cards which are commercially available comprise a cantilever type probe card, such as an epoxy ring probe card, a vertical type probe card, such as a Cobra probe card, and advanced MEMS probe cards commonly used for DRAMs.

Although the probe pin pitches of the cantilever type probe card may be as small as 40 µm, the cantilever type probe card is only suitable for testing pads disposed around a periphery of a wafer to be tested. Pads inside of the wafer can not be tested and the number of the probe pins is also limited. As for the vertical type probe cards, such as U.S. Pat. No. 4,027,935 titled "Contact for an electrical contactor assembly", although the pads inside of the wafer can be tested and the number of probe pins is relatively less limited, there is a technical bottleneck for the probe pin pitches to be smaller than 100 µm. In addition, the vertical type probe card is only suitable for testing of flip chip packaged ICs.

Additionally, both the cantilever type and vertical type probe cards must be manually installed in a printed circuit board. As such, the manufacturing cost depends highly on the amount of probe pins. As requirement for probe pins increase, so does the manufacturing cost.

As for MEMS probe cards commonly used for DRAMs, such as U.S. Pat. No. 5,476,211 titled "Method of manufacturing electrical contacts, using a sacrificial member" or U.S. Pat. No. 6,268,015 titled "Method of making and using lithographic contact springs", the manufacturing process is very complicated. Specifically, fabrication complexity increases for probe pin pitches smaller than 70 µm. In addition, testing pad arrangements are limited. As such, relative costs for MEMS probe cards are high.

In summary, conventional probe cards are all limited to "one probe corresponding to one pad" type. When disposition of testing pads are adjusted, probe pins need to be re-fabricated. Further, the fabrication of probe cards is hindered by the process limitations of micron probe pins. Probe pin manufacturing costs using conventional fabrication methods, such as molding, drawing, or rolling, are not feasible. In addition, the configuration and size of probe pins are limited by many factors. Although a photolithography/etching method, such as Taiwan Patent Application No. 90107441 and 93107026, may be used to fabricate probe pins, they still use the "one probe corresponding to one pad" type. Therefore, probe cards, with small probe pin pitches to accommodate ICs with decreased spacing between pads and fabricated with relatively lower costs is desired to accommodate testing requirements of nanoelectronic devices.

Thus, in lieu of the above, the inventor of the present application has disclosed a novel conductive film structure, manufacturing method thereof, and a probe card having the conductive film structure. U.S. patent application Ser. No. 12/032,169 is incorporated by references herein. For this method, a single-layered conductive film is first formed overlying a substrate. The single-layered conductive film comprises an insulating film and micro-wires formed therein. Then, the single-layered conductive film is removed from the substrate and stacked with other single-layered conductive films formed and removed by the same method to form a conductive film structure. The micro-wires in the conductive film structure can be used as the probe pins in probe cards. By using a photolithography and etching process, diameters and pitches of probe pins can be easily controlled, overcoming conventional probe pin fabricating difficulties, such as limiting to low pin counts, having to manually process each pin, arrangement limitation of pins, and further shrinking pin diameters. Additionally, because the conductive film type probe card provided by the inventor is not a "one probe corresponding to one pad" type probe card, it overcomes the technical bottleneck of probe pin pitches and probe pin counts for conventional probe cards and has greater application potential. However, the method mention above requires repeatedly forming and removing a plurality of single-layered conductive films. Additionally, the single-layered conductive films need to be individually adhered one by one, thus, taking up time and effort.

Thus, in order to reduce process work time and effort of the conductive film type probe card, the embodiments of the present invention provide a simple method for fabricating the conductive film structure, a conductive film structure, and a conductive film type probe device for ICs (probe cards) having the conductive film structure. The probe cards of embodiments of the invention are suitable for testing wafers with any kind of pad arrangements to accommodate ICs with decreased spacing between pads.

BRIEF SUMMARY OF THE INVENTION

In accordance with an embodiment of the invention, a method for forming a conductive film structure is provided, comprising: providing a flexible insulating substrate; forming a conductive film overlying the flexible substrate; patterning the conductive film to form a plurality if micro-wires overlying the flexible insulating substrate, wherein the micro-wires are extended substantially parallel to each other; forming an insulating layer overlying the flexible insulating substrate and the micro-wires; and winding or folding the flexible insulating substrate along an axis substantially parallel to an extending direction of the micro-wires to form a conducting lump.

In accordance with another embodiment of the invention, a conductive film structure is provided, comprising: an insulating bulk having a first surface and an opposite second surface; a spiroid or folding interface located in the insulating bulk and extending from the first surface to the second surface; and a plurality of micro-wires located in the insulating bulk, wherein extending directions of the micro-wires are substantially parallel to a normal vector of the first surface or the second surface, and wherein the micro-wires are disposed substantially along the spiroid or folding interface.

In accordance with yet another embodiment of the invention, a conductive film type probe device for ICs is provided, comprising: a circuit board having a plurality of first contacts and a plurality of second contacts, wherein the first contacts are used to electrically connect to a testing apparatus; and a conductive film structure as described in the embodiments of the invention mentioned above, wherein the each of the second contacts electrically connects to at least one of the micro-wires of the conductive film structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
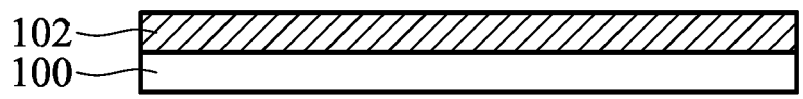
FIGS. 1A-1F are cross-sectional views showing the step of forming a conductive film structure in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In embodiments of the present invention, a conductive film structure, fabrication method thereof, and a conductive film type probe device for ICs are provided.

A conductive film structure of one embodiment of the present invention is formed by forming a plurality of micro-wires overlying a flexible insulating substrate to form a single-layered conductive film. Then, the single-layered conductive film is wound or folded to form a conductive film structure of a conducting lump type. The conductive film structure may be used as a component of an IC detecting device, such as a probe device or a probe card.

The embodiments of the present invention are illustrated in detail below in accordance with the accompany drawings. Throughout the various views and illustrative embodiments of the present invention, like reference numbers are used to designate like elements. The shape of each element or layer is not limited to the specific type in the drawings. Although the embodiments of the present invention may mainly be applied to IC probe devices, the conductive film structure may be adapted to other applications.

Figure 1B:
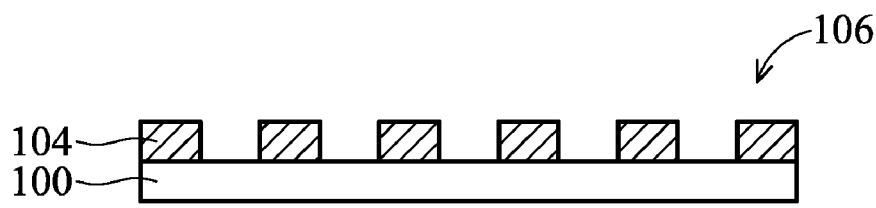

FIGS. 1A to 1F are cross-sectional views showing the steps for fabricating a conductive film structure according to one embodiment of the invention. As shown in FIG. 1A, a flexible insulating substrate 100 is first provided. A conductive film 102 is formed overlying the flexible insulating substrate 100. The flexible insulating substrate 100 may comprise a polymer, such as polydimethylsiloxane (PDMS), polyimide (PI), polyethylene terephthalate (PET), derivatives thereof, the like thereof, or combinations thereof. The flexible insulating substrate 100 is preferably a flexible insulating material with good elasticity. After completing fabrication of the conductive film structure, a material with elasticity can be used to absorb the impact force transmitted to micro-wires in the conductive film structure when contacting with testing pads, thus, to improve the reliability and impact resistance of the conductive film structure. In one embodiment, the thickness of the flexible insulating substrate 100 may be about 5 to 20 μm, or preferably about 7 to 15 μm. However, the thickness of the flexible insulating substrate 100 may be adjusted according to requirement, wherein the thickness of the flexible insulating substrate will affect the spacing of the micro-wires in the conductive film structure. The conductive film 102 may comprise any conductive material. In one embodiment, the conductive film 102 is preferably metal material, such as nickel, cobalt, gold, copper, aluminum, platinum, alloy, stacked layers thereof, or combinations thereof. In addition, transparent conductive film, such as indium tin oxide (ITO), indium zinc oxide (IZO), or combinations thereof, may also be used. The conductive film 102 may be formed by, for example, a sputtering, evaporation, electroplating, or any other suitable methods. It should be appreciated that damage to the flexible insulating substrate 100 needs to be prevented when forming the conductive film 102. The thickness of the conductive film 102 may affect the cross-sectional areas of micro-wires formed in the conductive film structure in subsequent processes, and thus the thickness of the conductive film 102 may be adjusted according to requirements FIG. 1B shows an embodiment, wherein the conductive film 102 is patterned to form a plurality of micro-wires 104 overlying the flexible insulating substrate 100, to thus form a single-layered conductive film 106. FIG. 2A shows a top view of the single-layered conductive film 106 shown in FIG. 1B. As shown in FIG. 2A, long axis directions or extending directions of the micro-wires are substantially parallel to each other. In one embodiment, the spacing between the micro-wires is the same. For example, the spacing may be about 5 μm or smaller, such as about 1 to 3 μm. In addition, the cross-sections of the micro-wires may be rectangular and have a line width of about 5 μm. However, the cross-sections of the micro-wires are not limited to be rectangular. In other embodiments, the cross-sections of the micro-wires may be any other suitable shapes, such as a square, rectangle, half-circle, half-ellipse, trapezium, or triangle. In one embodiment, the cross-sections of the micro-wires all have the same shape. However, in another embodiment, the cross-sections of the micro-wires all have different shapes or partially have the same shape. In addition, the spacing between the micro-wires 104 may be adjusted. In one embodiment, the spacing between the micro-wires 104 is all the same. However, in another embodiment, the spacing between the micro-wires are all different or partially the same. Although the micro-wires shown in FIG. 2A are straight lines having long axis directions or extending directions substantially parallel to each other, the micro-wires of the embodiment of the present invention are not limited to this type. For example, FIG. 2B shows a top view of a single-layered conductive film 106 according to another embodiment of the invention. The micro-wires 104 are not in straight lines but have many inflections while the long axis direction or extending direction of each micro-wire is still parallel to each other. FIG. 2A or 2B merely illustrates exemplary single-layered conductive films of embodiments of the present invention. Any single-layered conductive film, which has linking lines between two opposite ends of each micro-wire which are substantially parallel to each other, is within the scope of the embodiments of the present invention. From the following description, it should be understood that two opposite ends of each micro-wire will serve as electrical contact points with other conducting structures, such as with pads of ICs to be tested and with a circuit board of a testing apparatus.

The single-layered conductive film of one embodiment is formed by patterning the conductive film 102 overlying the flexible insulating substrate 100 to form a plurality of micro-wires 104. The patterning of the conductive film 102 may be performed using different methods. In one embodiment, the conductive film 102 is patterned by using an energy beam to form a plurality of micro-wires 104. Through exposure or impact of the energy beam, a portion of the conductive film 102 is removed and the desired portions of the micro-wires 104 are left. Suitable energy beams include a laser beam, ion beam, electron beam, plasma, or combinations thereof. In one embodiment, the conductive film 102 is patterned by using a laser beam. Optical elements may also be used to divide a single laser beam into a plurality of laser beams, which may remove the conductive film 102 to form a plurality of micro-wires 104 in one single laser exposure to save process time. In addition, the conductive film 102 may also be patterned by a photolithography and etching process to remove a portion of the conductive film 102. For example, a patterned photoresist layer may be formed overlying the conductive film 102, exposing a portion of the conductive film 102. Then, the exposed conductive film 102 is removed by an etching process to form a plurality of micro-wires 104. Alternatively, a lift-off process may be used. First, a patterned photoresist layer is formed overlying the flexible insulating substrate 100 followed by depositing of a conductive film 102. In this case, the conductive film 102 is located overlying the patterned photoresist layer and the flexible insulating substrate 100 exposed by the patterned photoresist layer. After removing the patterned photoresist layer, a plurality of micro-wires 104 may be left overlying the flexible insulating substrate 100.

Figure 1C:
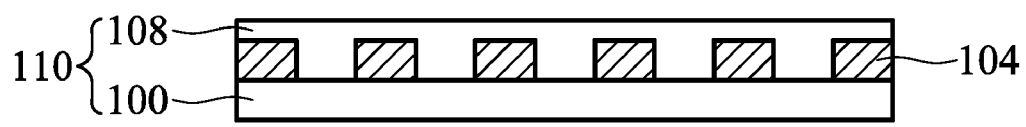
Figure 2A:
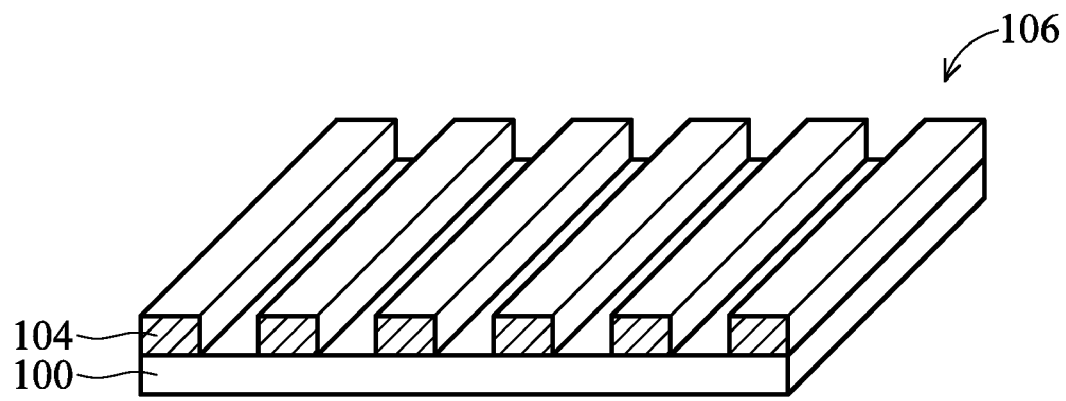
FIG. 2A is a top view showing the single-layered conductive film shown in FIG. 1B.
Figure 2B:
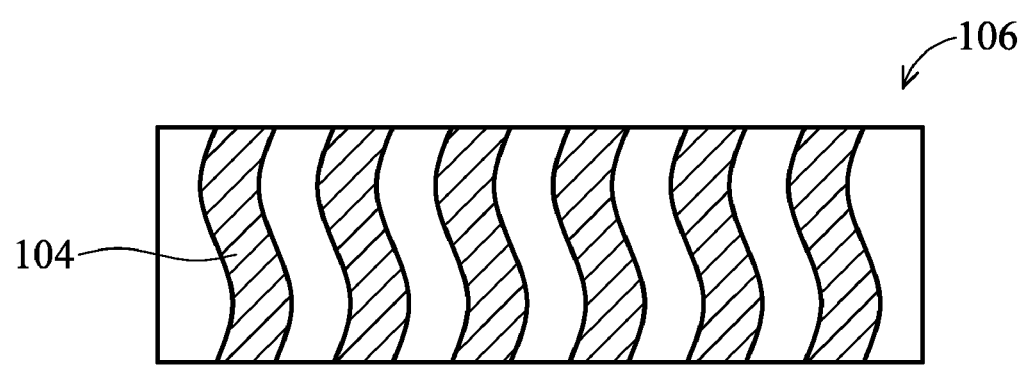
FIG. 2B is a top view showing a single-layered conductive film in accordance with another embodiment of the present invention.

Referring to FIG. 1C, after forming the micro-wires 104, an insulating layer 108 is formed overlying the flexible insulating substrate 100 and the micro-wires 104. The insulating layer 108 may be used as an electrical isolation between the micro-wires 104 and also as an adhesive during the subsequent winding or folding process. The insulating layer 108 may comprise a polymer, an adhesive, an adhesive polymer, or combinations thereof. The flexible insulating substrate 100 and the insulating layer 108 together form an insulating protecting layer 110.

Figure 1D:
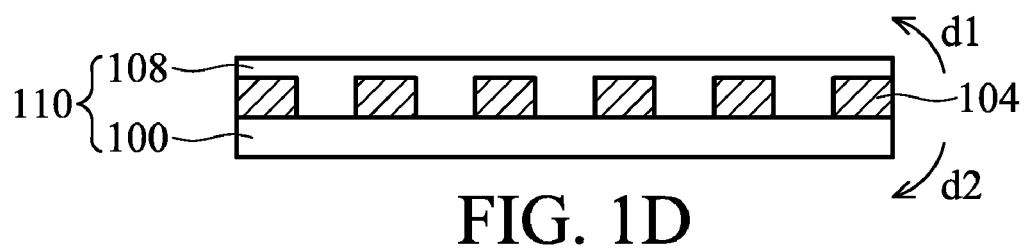
Figure 1E:
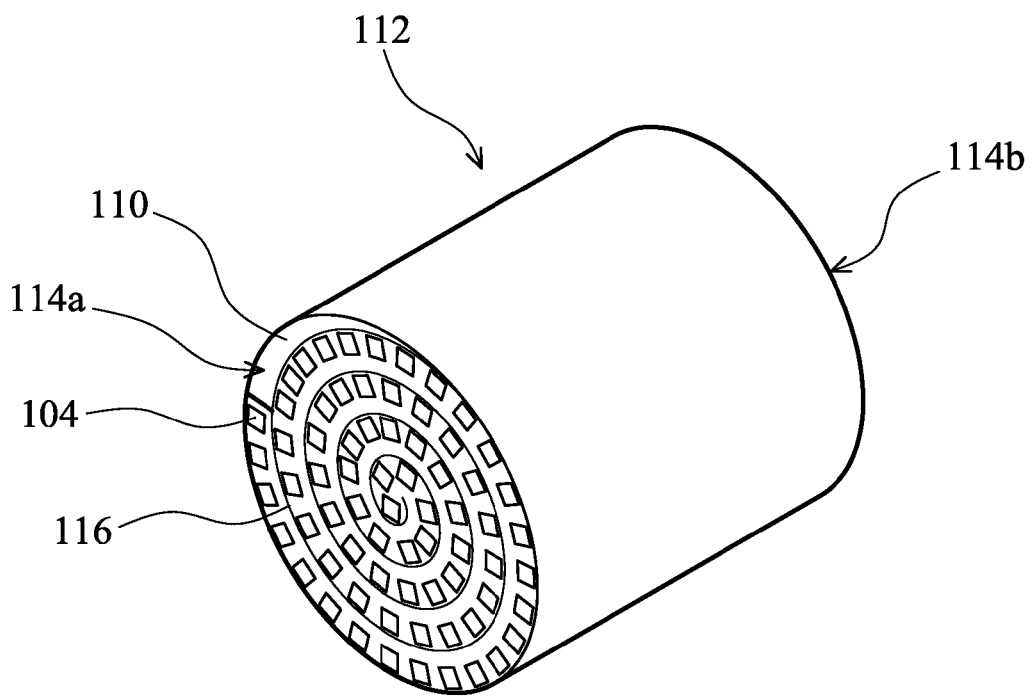
Figure 1F:
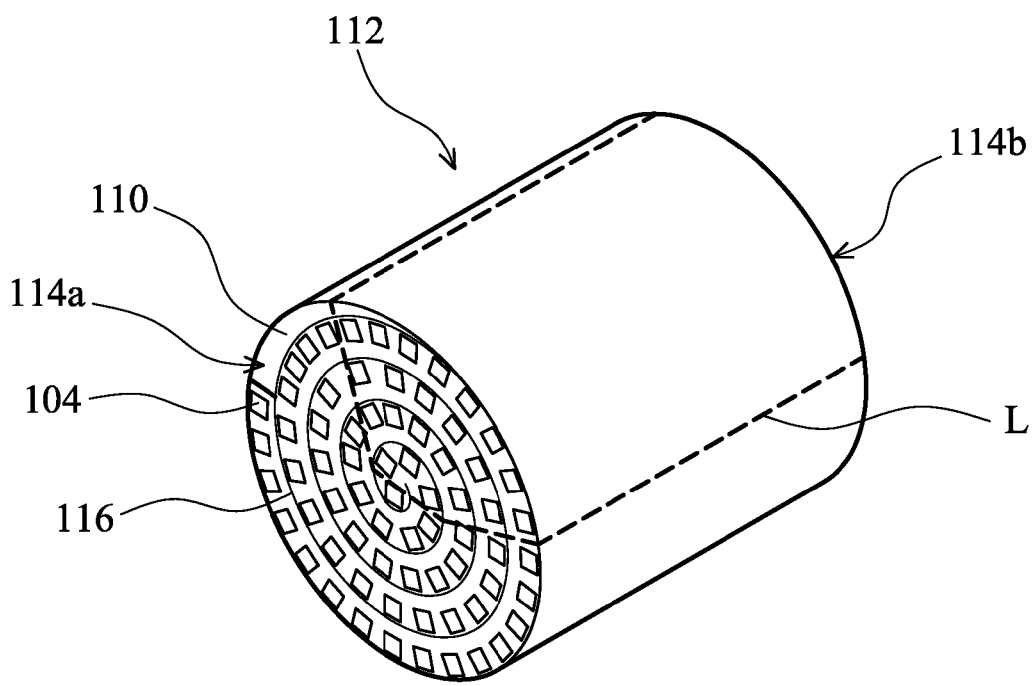

Subsequently, in one embodiment of the invention as shown in FIG. 1D, the flexible insulating substrate 100 is directly wound along an axis substantially parallel to an extending direction (or long axis direction) of the micro-wires 104 to form a conducting lump 112 as shown in FIG. 1E. As shown in FIG. 1D, the flexible insulating substrate 100 may be wound with a direction d1 or direction d2. In one embodiment, the flexible insulating substrate 100 is directly wound with a direction d1. The insulating layer 108 is preferably a polymer layer with an adhesive added thereon. During the winding process, the adhesive (not shown) may fix the wound conducting lump. Alternatively, the insulating layer 108 may be an adhesive polymer layer to fix the wound conducting lump. In another embodiment, the flexible insulating substrate 100 is directly wound with a direction d2. In this case, it is preferable to apply an adhesive overlying the bottom of the flexible insulating substrate 100 to fix the wound conducting lump. FIG. 1E illustrates a cylindrical conducting lump 112 formed by a direct winding process for a conductive film structure of one embodiment of the present invention.

Referring to FIG. 1E, the conducting lump 112 (conductive film structure) comprises an insulating bulk 110, which is constructed by the insulating protecting layer 110 shown in FIG. 1D, having a first surface 114a and an opposite second surface 114b. The conducting lump also comprises a spiroid interface 116 located in the insulating bulk 110 and extending from the first surface 114a to the second surface 114b. The conducting lump 112 further comprises a plurality of micro-wires 104, wherein the extending directions (or long axis directions) of the micro-wires 104 are substantially parallel to a normal vector of the first surface 114a or the second surface 114b, and wherein the micro-wires 104 are disposed substantially along the spiroid interface 116.

In one embodiment, after forming the conducting lump 112, a conducting material, such as copper, gold, or silver, may be deposited overlying two opposite ends of the micro-wires 104 by, for example, electrochemical deposition to elongate the micro-wires 104 such that the opposite ends thereof are exposed or protruding from the conducting lump 112. In another embodiment, after forming the conducting lump 112, a portion of the flexible insulating substrate 100 may be removed by using, for example, a laser beam or other suitable methods such that at least one end of the micro-wires 104 protrudes from the conducting lump 112. The exposed or protruding micro-wires 104 may facilitate the contact and electrical path between the conducting lump 112 and other devices.

Besides the conductive film structure of the conducting lump 112 illustrated in FIG. 1E, in other embodiments of the invention, the conductive film structures also comprise smaller conducting lumps cut from the conducting lump 112 shown in FIG. 1E. For example, the conducting lump 112 may be cut along the dashed line L shown in FIG. 1F to obtain a smaller conducting lump. However, the cutting region is not limited to that shown in FIG. 1F.

The conductive film structure of the present invention comprises the conducting lump 112 shown in FIG. 1E or the smaller conducting lump cut from the conducting lump 112. The conductive film structures mentioned above may be used as a component of a conductive film type probe device for ICs.

Figure 3:
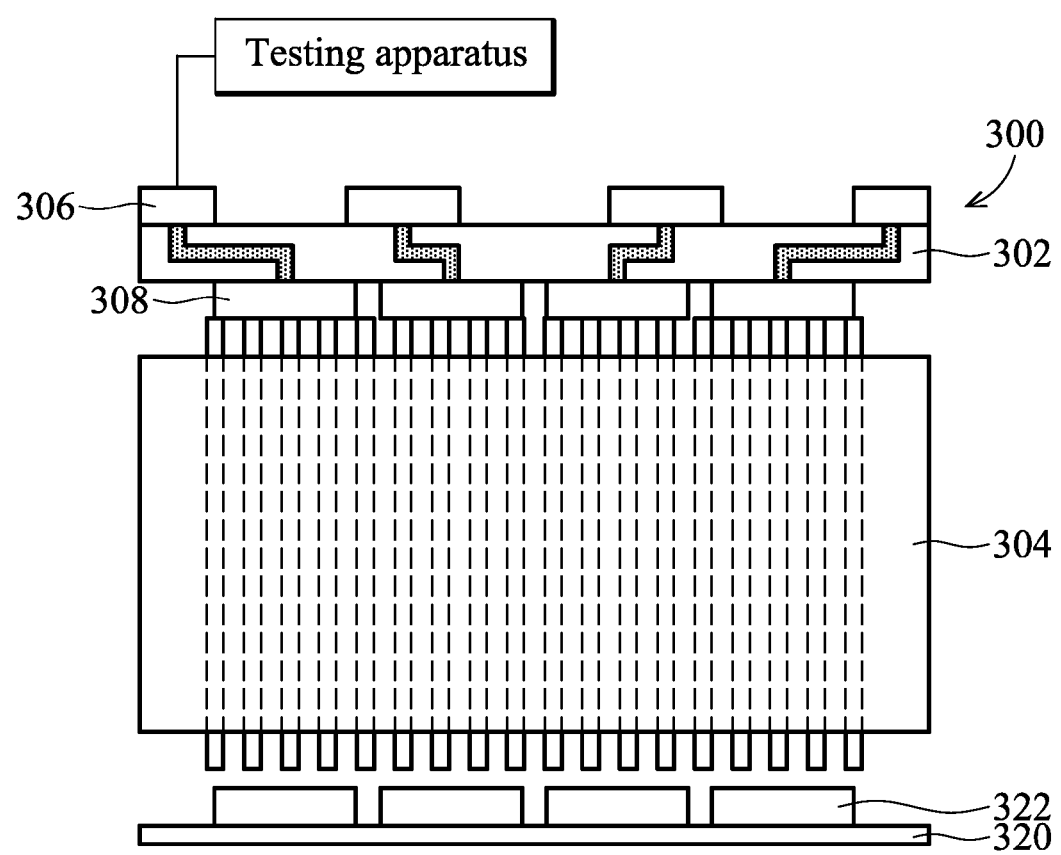
FIG. 3 is a cross-sectional view showing a conductive film type probe device for ICs in accordance with an embodiment of the present invention.

FIG. 3 shows a cross-sectional view of a conductive film type probe device for ICs in accordance with an embodiment of the present invention. The conductive film type probe device for an IC 300 comprises a circuit board 302 and a conductive film structure 304. The circuit board 302 has a plurality of first contacts 306 and a plurality of second contacts 308 disposed overlying opposite sides of the circuit board 302, respectively. The first contacts 306 are used to electrically connect to a testing apparatus while the second contacts 308 are used to electrically connect to the micro-wires of the conductive film structure 304. The conductive film structure 304 may be linked to the circuit board 302 by an adhesive or any physical locking design to make each of the second contacts 308 electrically connected to at least one of the micro-wires of the conductive film structure 304. As shown in FIG. 3, each second contact 308 electrically connects to a plurality of different micro-wires. However, each second contact 308 is not limited to electrically connecting to a plurality of different micro-wires. Alternatively, in another embodiment, each second contact 308 only electrically connects to one different micro-wire. In yet another embodiment, a portion of the second contacts 308 only electrically connect to one different micro-wire while another portion of the second contacts 308 electrically connect to a plurality of different micro-wires, respectively. FIG. 3 further shows a wafer 320 which is to be tested, having ICs to be tested therein and having a plurality of contacts 322. In one embodiment, the second contacts 308 are arranged corresponding to, and in the same manner as the contacts of the IC of the wafer 320 to be tested. The testing apparatus may move the conductive film type probe device for the IC 300 to make the micro-wires electrically connect to the pads 322. Electrical information of the IC to be tested may be transmitted to the testing apparatus for reading through the electrical connection between the pads 322 and the micro-wires. The conductive film type probe device for the IC 300 of an embodiment of the invention differs from conventional probe cards with "one probe corresponding to one pad" type. In one embodiment, one single pad 322 may contact with a plurality of probes (micro-wires). In addition, spacing or pitches between probes (spacing between micro-wires) and cross-sections of probes (shapes or cross-sectional areas of micro-wires) may be modified according to methods of the embodiments of the invention to accommodate different testing situations. In one embodiment, the conducting lump 112 illustrated in FIG. 1E may be directly used as the conductive film structure 304 of the conductive film type probe device for the IC 300. The first surface 114a or the second surface 114b may exactly fit with the area and shape of the wafer 320 to be tested. Thus, devices of entire wafer 320 to be tested may be detected in one testing process. In one embodiment, the layout information of the contacts 322 of the wafer 320 to be tested may be first inputted to the testing apparatus. Thus, each probe (micro-wire) and its contacting pad connected to a corresponding device may be firstly addressed or identified. That is, each probe, and which pad an individual probe electrically connects to, may be firstly identified. Therefore, electrical information of all devices in the entire wafer to be tested may be obtained in a single test.

The conductive film structure of embodiments of the invention may be formed, as shown in FIGS. 1A-1F, by directly winding the structure illustrated in FIG. 1C. However, in another embodiment, another fabrication method may be applied. For example, the conductive film structure may also be formed by winding the flexible insulating substrate around a winding core. Alternatively, the conductive film structure may not be formed by winding but by folding instead. In the following description, other possible methods to form the conductive film structure will be illustrated in more detail.

Figure 4:
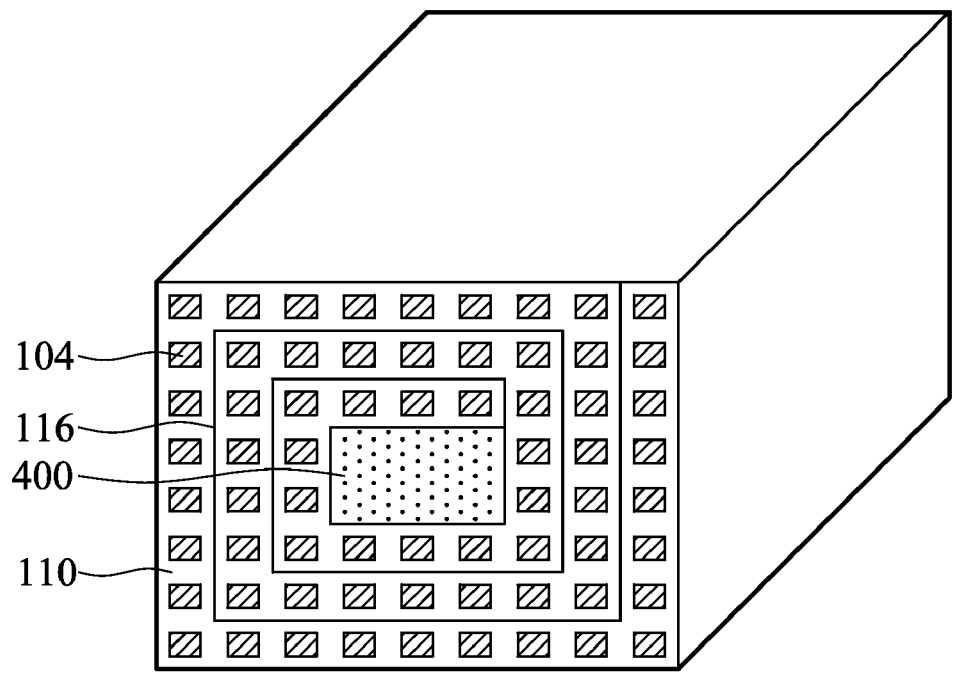
FIG. 4 shows the process of winding the structure shown in FIG. 1C around a winding core to form a conducting lump in accordance with an embodiment of the present invention.

Referring to FIG. 4, a conductive film structure or conducting lump of an embodiment is formed by winding the structure shown in FIG. 1C around a winding core 400. The winding core 400 is substantially a pillar structure. The cross-section of the pillar structure may be any suitable shape, such as a square, rectangle, circle, ellipse, trapezium, or triangle and so on. Through rotating the winding core 400, the winding of the structure shown in FIG. 1C may be initiated, and thus a conducting lump may be formed. If winding cores with different cross-section shapes are used, types of the spiroid interface may be different, respectively. In addition, a cutting process similar to the cutting process shown in FIG. 1F may be performed to obtain a smaller conducting lump serving as a conductive film structure. The conductive film structure may be used by the conductive film type probe device for ICs shown in FIG. 3.

Figure 5:
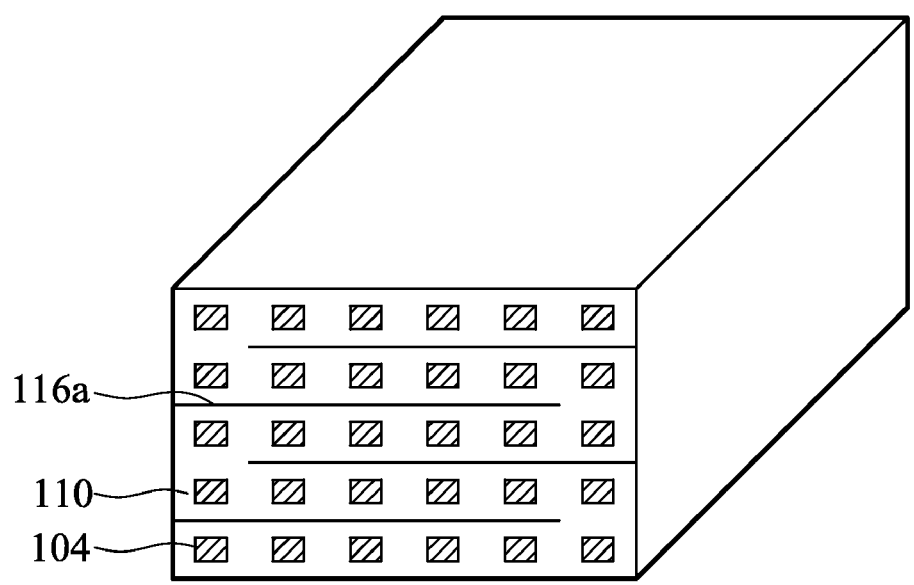
FIG. 5 shows a conducting lump formed by folding in accordance with an embodiment of the present invention.

The conductive film structure may be formed not only by direct winding or winding around a winding core, but also by folding. FIG. 5 shows a conductive film structure formed by folding according to an embodiment of the invention. The conductive film structure or conducting lump shown in FIG. 5 is formed by folding the structure shown in FIG. 1C. The folded conductive film structure (or conducting lump) is similar to the structure shown in FIG. 1E or FIG. 4, however, the folded conductive film does not comprise a spiroid interface but a folding interface 116a instead. Similarly, a cutting process may be performed to obtain a smaller conductive film structure (or conducting lump), which may be used in the conductive film type probe device for ICs shown in FIG. 3.

Figure 6:
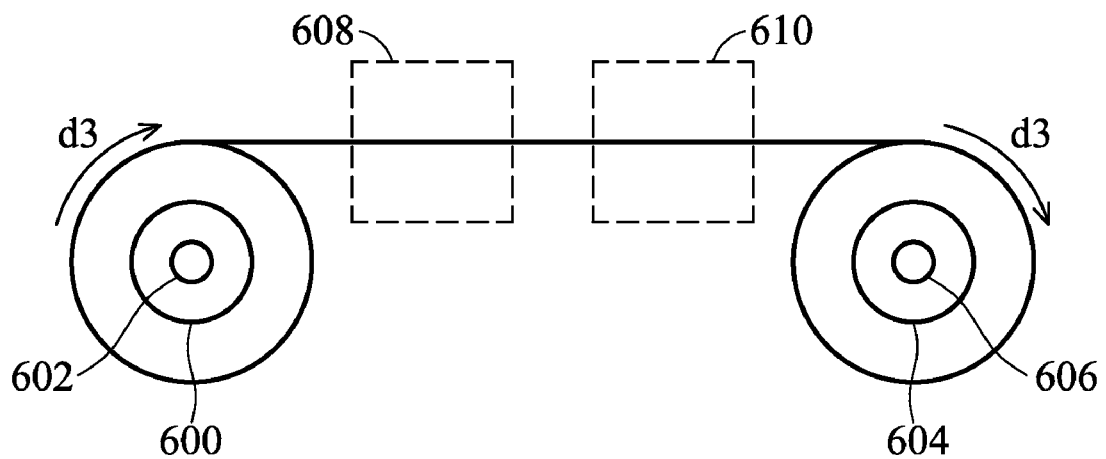
FIG. 6 shows forming a conducting lump by a roll-to-roll process in accordance with an embodiment of the present invention.

The fabrication of the conductive film structure of embodiments of the invention may be simultaneously formed by a roll-to-roll process. FIG. 6 shows the fabrication of the conductive film structure using a roll-to-roll process in accordance with an embodiment of the invention. First, the structure shown in FIG. 1A is wound into a cylindrical structure around a first roller 600 and the other end of the structure is disposed around a second roller 604. Then, the first roller 600 and the second roller 604 are rotated around the rotating axes 602 and 606, for example, with a direction d3. Meanwhile, a conductive film patterning element 608 is used to pattern the conductive film 102 into micro-wires 104. An insulating layer forming element 610 is used to form an insulating layer 108 overlying the flexible insulating substrate 100 and the micro-wires 104. Thus, a conductive film structure or a conducting lump 112 may be formed through the winding of the second roller 604. The conductive film patterning element 608 may be, for example, a laser beam apparatus facilitating fast patterning of the conductive film 102 into micro-wires 104. The insulating layer forming element 610 may be, for example, an apparatus for applying adhesive insulating material. In one embodiment, the conductive film structure or the conducting lump 112 obtained may directly be used as the conducting structure of the conductive film type probe device for ICs. Alternatively, a smaller conducting lump may be cut from the conducting lump 112 and be used for desired applications.

The embodiments of the present invention have many advantageous features. In addition to all of the advantageous features similar to the previous U.S. patent application Ser. No. 12/032,169 of the inventor, the embodiments of the present invention further comprise an additional important advantageous feature, wherein process work time and effort of the conductive film type probe device for ICs is reduced. Specifically, through winding or folding a single-layered conductive film, a conducting lump with sufficient thickness may be quickly formed and be used as a conductive film structure of a conductive film type probe device for ICs. Thus, eliminating requirement for stacking each conductive film one by one to form a conductive film structure and saving fabrication time. In addition, spacing between probes (spacing between micro-wires or probe pin pitch) and cross-sections of probes (shapes or cross-sectional areas of micro-wires) may be modified according to methods of the embodiments of the invention to accommodate different testing situations. The conductive film structure or the conductive film type probe device for ICs of the embodiments of the present invention may replace conventional probe cards due to their simplified, faster, and lower cost manufacturing process, and ability to accommodate ICs with decreased spacing between pads, thus meeting nano scale technology trend requirements. In addition, the conductive film structures of the embodiments of the invention are not limited to the application in probe devices for ICs. In contrast, the conductive film structure of the embodiments of the invention may be used in many other applications, such as a microelectronic conducting element.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a conductive film structure, comprising:
    providing a flexible insulating substrate;
    forming a conductive film overlying the flexible insulating substrate;
    patterning the conductive film to form a plurality of micro-wires overlying the flexible insulating substrate, wherein the micro-wires are extended substantially parallel to each other;
    forming an insulating layer overlying the flexible insulating substrate and the micro-wires, wherein the insulating layer comprises a polymer layer with an adhesive layer added thereon or an adhesive polymer layer;
    winding or folding the flexible insulating substrate along an axis substantially parallel to an extending direction of the micro-wires to form a conducting lump; and
    depositing a conductive material overlying two opposite ends of the micro-wires by electrochemical deposition to elongate the micro-wires such that the opposite ends thereof are exposed or protrude from the conducting lump.

2. The method for forming a conductive film structure as claimed in claim 1, wherein two opposite ends of each of the micro-wires are exposed from surfaces of the conducting lump.

3. The method for forming a conductive film structure as claimed in claim 1, further comprising removing a portion of the flexible insulating substrate such that at least one end of the micro-wires protrudes from the conducting lump.

4. The method for forming a conductive film structure as claimed in claim 1, wherein the patterning of the conductive film comprises removing a portion of the conductive film by an energy beam comprising a laser beam, ion beam, electron beam, plasma, or combinations thereof.

5. The method for forming a conductive film structure as claimed in claim 1, wherein the winding of the flexible insulating substrate is a direct winding.

6. The method for forming a conductive film structure as claimed in claim 1, wherein the flexible insulating substrate is wound around a winding core.

7. The method for forming a conductive film structure as claimed in claim 1, wherein the flexible insulating substrate comprises a polymer comprising polydimethylsiloxane, polyimide, polyethylene terephthalate, derivatives thereof, or combinations thereof.

8. The method for forming a conductive film structure as claimed in claim 1, wherein the micro-wires comprise nickel, cobalt, gold, copper, aluminum, platinum, indium tin oxide, indium zinc oxide, or combinations thereof.

9. The method for forming a conductive film structure as claimed in claim 1, further comprising cutting the conducting lump to obtain a smaller conducting lump.

10. The method for forming a conductive film structure as claimed in claim 1, wherein each spacing between the micro-wires is substantially the same.

11. A method for forming a conductive film structure, comprising:
    providing a flexible insulating substrate;
    forming a conductive film overlying the flexible insulating substrate;
    patterning the conductive film to form a plurality of micro-wires overlying the flexible insulating substrate, wherein the micro-wires are extended substantially parallel to each other;
    forming an insulating layer overlying the flexible insulating substrate and the micro-wires;
    winding or folding the flexible insulating substrate along an axis substantially parallel to an extending direction of the micro-wires to form a conducting lump; and
    depositing a conductive material overlying two opposite ends of the micro-wires by electrochemical deposition to elongate the micro-wires such that the opposite ends thereof are exposed or protrude from the conducting lump.

12. The method for forming a conductive film structure as claimed in claim 11, wherein two opposite ends of each of the micro-wires are exposed from surfaces of the conducting lump.

13. The method for forming a conductive film structure as claimed in claim 11, further comprising removing a portion of the flexible insulating substrate such that at least one end of the micro-wires protrudes from the conducting lump.

14. The method for forming a conductive film structure as claimed in claim 11, wherein the patterning of the conductive film comprises removing a portion of the conductive film by an energy beam comprising a laser beam, ion beam, electron beam, plasma, or combinations thereof.

15. The method for forming a conductive film structure as claimed in claim 11, wherein the winding of the flexible insulating substrate is a direct winding.

16. The method for forming a conductive film structure as claimed in claim 11, wherein the flexible insulating substrate is wound around a winding core.

17. The method for forming a conductive film structure as claimed in claim 11, further comprising cutting the conducting lump to obtain a smaller conducting lump.

18. A method for forming a conductive film structure, comprising:
    providing a flexible insulating substrate;
    forming a conductive film overlying the flexible insulating substrate;
    patterning the conductive film to form a plurality of micro-wires overlying the flexible insulating substrate, wherein the micro-wires are extended substantially parallel to each other;
    forming an insulating layer overlying the flexible insulating substrate and the micro-wires; and
winding or folding the flexible insulating substrate along an axis substantially parallel to an extending direction of the micro-wires to form a conducting lump, wherein the winding of the flexible insulating substrate is a direct winding.

19. The method for forming a conductive film structure as claimed in claim 18, further comprising removing a portion of the flexible insulating substrate such that at least one end of the micro-wires protrudes from the conducting lump.

* * * * *